US006573755B2

(12) United States Patent
Fletcher et al.

(10) Patent No.: US 6,573,755 B2
(45) Date of Patent: Jun. 3, 2003

(54) SYMMETRIC DIFFERENTIAL DOMINO "AND GATE"

(75) Inventors: Thomas Fletcher, Portland, OR (US); Giao Pham, Portland, OR (US); Paul Madland, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/892,565

(22) Filed: Jun. 28, 2001

(65) Prior Publication Data

US 2003/0001622 A1 Jan. 2, 2003

(51) Int. Cl.$^7$ ........................ H03K 19/096; H03K 19/20
(52) U.S. Cl. ........................... 326/95; 326/121; 326/98
(58) Field of Search ........................ 326/95, 98, 121; 326/83; 327/200, 108, 225

(56) References Cited

U.S. PATENT DOCUMENTS

| | | | | |
|---|---|---|---|---|
| 4,570,084 A | * | 2/1986 | Griffin et al. | 307/452 |
| 5,568,069 A | * | 10/1996 | Chow | 326/113 |
| 5,777,491 A | * | 7/1998 | Hwang et al. | 326/113 |
| 5,977,789 A | * | 11/1999 | Gayles | 326/17 |
| 6,028,454 A | * | 2/2000 | Elmasry et al. | 326/115 |
| 6,208,907 B1 | | 3/2001 | Durham et al. | |

FOREIGN PATENT DOCUMENTS

| JP | 405259893 A | * 10/1993 | 326/98 |
|---|---|---|---|

OTHER PUBLICATIONS

Yee et al, "Clock–Delayed Domino for Dynamic Circuit Design", IEEE Transactions on Very Large Scale Integration (VLSI) Systems, vol. 8, No. 4, Aug. 2000, pp 425–430.

Yee et al, "Clock–Delayed Domino for Adder and Combinational Logic Design", IEEE, 1063–6404/96, pp 332–337, 1996.

Jung, Perepelitsa, Sobelman, "Time Borrowing in High-Speed Functional Units Using Skew–Tolerant Domino Circuits," Proceedings, IEEE International Symposium on Circuits and Systems, pp. V–641–V–644, 2000.

"Output Prediction Logic: A High–Performance CMOS Design Technique", pp. 1–32, Carl Sechen Mar. 17, 2000.

Taub, *Digital Circuits and Microprocessors*, pp. 205–212, McGraw–Hill, 1982.

Related U.S. patent application Ser. No. 10/020,447, filed Dec. 18, 2001.

Related U.S. patent application Ser. No. 09/893,868, filed Jun. 29, 2001.

Related U.S. patent application Ser. No. 09/956,903, filed Sep. 21, 2001.

* cited by examiner

*Primary Examiner*—Daniel Chang
(74) *Attorney, Agent, or Firm*—Kenyon & Kenyon

(57) ABSTRACT

A symmetric differential domino AND gate. In a further embodiment, the symmetric differential domino AND gate has a first evaluation block of transistors and a second evaluation block of transistors, and the first evaluation block and second evaluation block have the same number of transistors and the same size transistors.

32 Claims, 4 Drawing Sheets

SYMMETRIC DIFFERENTIAL DOMINO "AND GATE"

FIELD OF THE INVENTION

Embodiments of the present invention relate to logic gates. In particular, embodiments of the present invention relate to the topology of differential domino logic gates.

BACKGROUND

Domino logic is often used in high speed integrated circuits. A domino circuit is a type of circuit that is arranged in stages with the outputs from one stage used as inputs into the next stage. A stage in the domino circuit may be, for example, a logic gate. The clock used with a domino circuit typically is delayed for each of the individual stages to provide a set-up time for the stages. The individual domino logic gates typically have one or more precharge blocks, which force the circuit to a known state during one phase of a clock, and one or more evaluation blocks, which provide output values that are based on the input values. In such domino circuits, the clock may be said to have a precharge phase and an evaluation phase.

Domino circuits generally have a static stage in between the domino stages. For example, the domino circuit may have an inverter between the domino stages or a static complimentary metal-oxide semiconductor (CMOS) gate between the domino stages. Another example is the zipper domino circuit, which has a P-channel metal-oxide semiconductor (PMOS) gate between the domino stages. In a cascaded domino circuit, the outputs from one N-channel metal-oxide semiconductor (NMOS) domino gate (i.e., a gate with NMOS transistors in the evaluation block) may be directly connected to the inputs of another NMOS domino gate. Thus, a cascaded domino circuit does not have any invertors, static stages, or PMOS gates in the critical path of the logic.

Domino logic gates may be constructed as differential circuits. A differential circuit has complimentary sets of input and output terminals. The first set of input and output terminals may be referred to as the "true" inputs and outputs, and the second set may be referred to as the "compliment" inputs and outputs. For example, a differential "AND gate" may have a set of true inputs and may have a true output that outputs the result of a logical AND function for the true inputs. In addition, the differential AND gate may have a set of compliment inputs, each of which may receive the compliment values of that received by the corresponding true input, and may have a compliment output that outputs the compliment value of the true output.

Differential domino circuits have been shown to operate at higher speeds and have a smaller size that other comparable circuits. Some differential domino circuits, such as the cascaded differential domino circuits, may be difficult to design and manufacture because the true and compliment outputs of the gates in the circuit should begin to switch with the same edge rate and not be susceptible to pattern dependence. In addition, the clock may arrive at the same time, or before, the data. For these reasons, differential domino circuits such as cascaded differential domino circuits have not been widely used.

DETAILED DESCRIPTION

The present invention discloses differential domino logic gate topologies that may be more easily designed and manufactured while still predictably achieving the desired logic functionality. In embodiments of the present invention, the differential domino gate is symmetric. According to one embodiment, the differential domino gate is designed so that the load or capacitance for the true inputs to the gate is the same as the load for the compliment inputs to the gate. In a further embodiment, the pull down strength for the true output(s) (i.e., the resistance of the transistors pulling down the outputs) is the same as the pull down strength for the complement output(s). In a further embodiment, the pull down strength for the true inputs is the same as the pull down strength for the complement inputs. In a further embodiment, the Miller coupling is the same for the true inputs and complement inputs to the differential domino gate. In a further embodiment, the output drive strength is the same for the true and compliment output of the gate.

One embodiment of the present invention is a symmetric differential cascaded domino AND gate. In general, an "AND gate" is a circuit that implements the logical AND function, and a "NAND gate" is a circuit that implements the logical NAND function. A person or ordinary skill in the art would appreciate that a "differential AND gate" is the same as a differential NAND gate that has the true inputs/outputs switched with the compliment inputs/outputs. In addition, a person of ordinary skill in the art would appreciate that, pursuant to De Morgan's theorems, a differential AND gate could be used as a differential OR gate by inverting the polarity of inputs/outputs. Thus, the designation to a differential "AND gate" as used herein will be understood to include a NAND gate, OR gate, and NOR gate. The present invention may also be used to design other differential domino logic gates such as discussed below.

Figure 1:
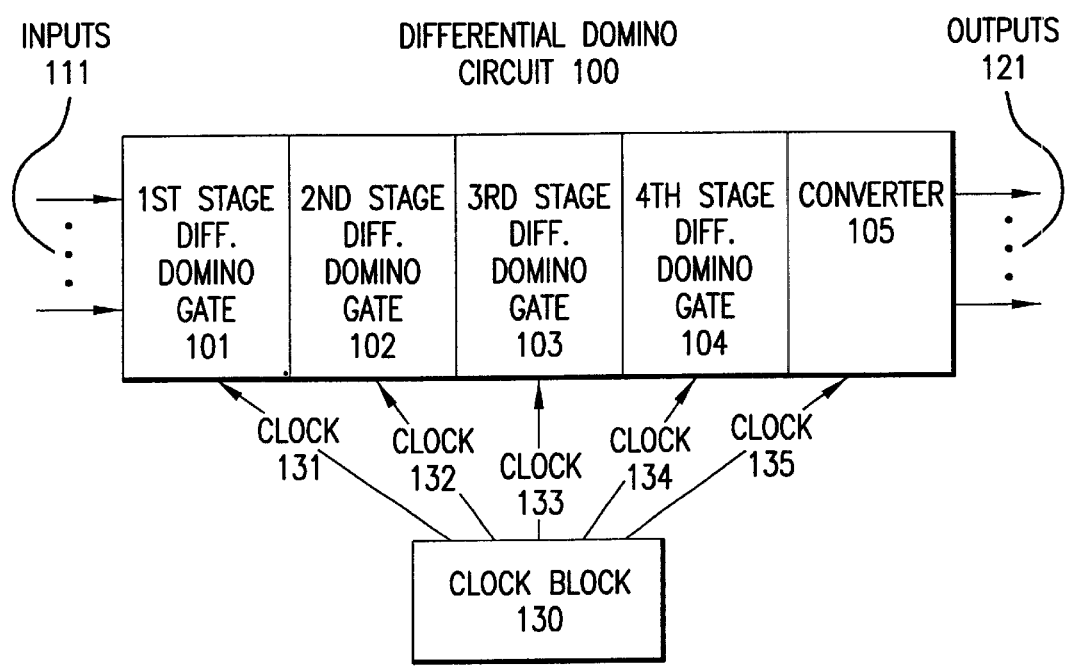
FIG. 1 is a block diagram of a symmetric differential domino circuit according to an embodiment of the present invention.

FIG. 1 is a block diagram of a symmetric differential domino circuit according to an embodiment of the present invention. FIG. 1 shows a differential domino circuit 100 that includes four stages (101 to 104) and a converter 105. Differential domino circuit 100 has inputs 111 and outputs 121. Differential domino circuit 100 may carry out a particular function. For example, differential domino circuit 100 may be an adder, a multiplier, etc. FIG. 1 shows a clock block 130 that produces clock signals 131 to 135 which are input to stages 101 to 105. In an embodiment, there is a small delay between the clock signals 131 to 135 (e.g., 10 picoseconds) in order to provide set up time for the stages of the domino logic operation. In the embodiment shown in FIG. 1, the first stage 101 is connected to the second stage 102, the second stage 102 is connected to the third stage 103, the third stage 103 is connected to the fourth stage 104, and the fourth stage 104 is connected to converter 105. In addition, clock block 130 is connected to each of the four stages (101 to 104) and to converter 105. Converter 105 may convert signals to static logic signals before they are output over outputs 121. In an embodiment, each stage 101 to 104 may be a differential logic gate, such as an AND gate, OR gate, etc. In other embodiments, stages 101 to 104 may be other components, such as for example a carry generate gate or a four-to-two reducer. Examples of differential logic gates that may be used as stages 101 to 104 are discussed below. In an embodiment circuit 100 is a cascaded differential domino circuit and each sage 101 to 104 are N-channel metal-oxide semiconductor domino gates, with the outputs of each stage directly connected to the inputs of the next stage. As used herein, two components A and B are said to be "directly connected" if there is a logic path between the two components that does not have any other components (e.g., gates or transistors) between components A and B but may include lead lines or connector lines between the components.

Figure 2:
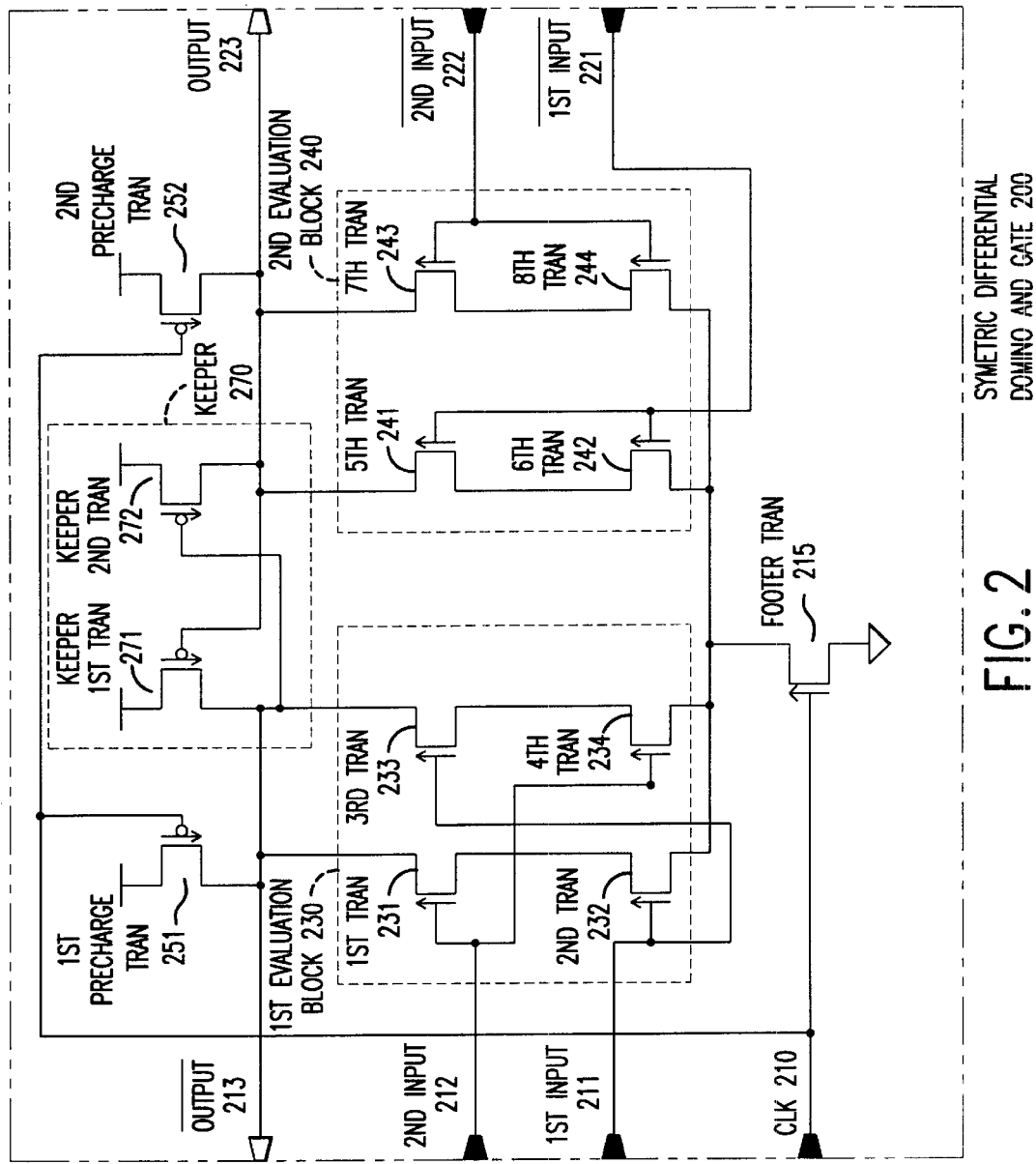
FIG. 2 is a partial block diagram of a symmetric differential domino AND gate according to an embodiment of the present invention.
Figure 3:
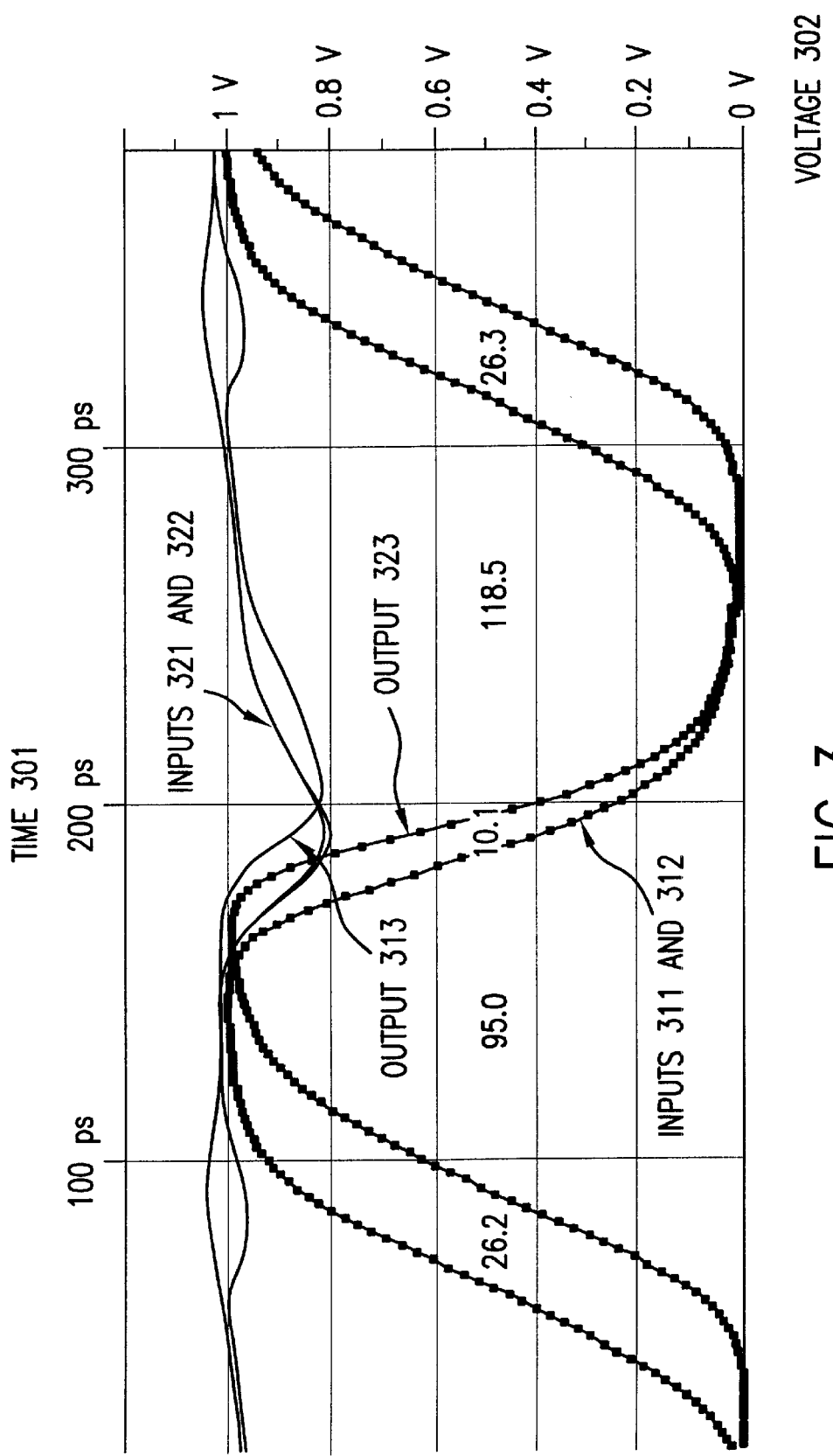
FIG. 3 is a partial timing diagram that illustrates a snapshot of the operation of a symmetric differential domino AND gate according to an embodiment of the present invention.

FIG. 2 is a partial block diagram of a symmetric differential domino AND gate according to an embodiment of the present invention. FIG. 2 shows differential domino AND gate 200 that has a clock input 210, a first input 211, and a second input 212. In addition, differential domino AND gate 200 has a negative first input 221 and a negative second input 222. In an embodiment, negative first input 221 receives the compliment of the value received on first input 211, and negative second input 222 receives the compliment of the value received on second input 212. Differential domino AND gate 200 also has an output 223 and a negative output 213. In an embodiment, negative output 213 outputs the compliment of the value output at output 223. As would be appreciated by a person of skill in the art, an input "value" that is received by AND gate 200, or output by AND gate 200, is a voltage range that represents a logical value. Examples of voltage ranges for input and output values are shown in FIG. 3. In an embodiment, input 211 and input 212 may be referred to as true inputs, input 221 and input 222 may be referred to as compliment inputs, output 223 may be referred to as the true output, and output 213 may be referred to as the compliment output.

In the embodiment shown in FIG. 2, differential domino AND gate 200 has a transistor 215, two precharge transistors (first precharge transistor 251 and second precharge transistor 252), a keeper 270, a first evaluation block 230, and a second evaluation block 240. In this embodiment, transistor 215 has a source terminal ("source") connected to ground, a drain terminal ("drain") connected to first evaluation block 230 and second evaluation block 240, and a gate connected to clock input 210. Transistor 215 maybe referred to as a footer transistor because it is at the bottom of the evaluation stacks. In this embodiment, footer transistor 215 is an NMOS transistor. In other embodiments, the circuit may not have a clocked transistor at the bottom of the evaluation stacks. In this embodiment, clock 210 is connected to the gates of first precharge transistor 251 and second precharge transistor 252, and first precharge transistor 251 and second precharge transistor 252 are PMOS transistors. The source of first precharge transistor 251 and the source of second precharge transistor 252 are each connected to Vcc. The drain of first precharge transistors 251 is connected to negative output 213, and the drain of second precharge transistor 252 is connected to output 223. In this embodiment first precharge transistor 251 and second precharge transistor 252 determine outputs of differential domino AND gate 200 during the precharge phase, and footer transistor 215 enables the determination of the outputs of differential domino AND gate 200 during the evaluation phase.

Keeper 270 includes a first keeper transistor 271 and second keeper transistor 272. In this embodiment, the source terminals of first keeper transistor 271 and of second keeper transistor 272 are each connected to Vcc. In this embodiment, first keeper transistor 271 and second keeper transistor 272 are PMOS transistors. The drain of first keeper transistor 271 is connected to negative output 213 and to the gate of second transistor 272. Similarly, the drain of second keeper transistor 272 is connected to output 223 and to the gate of first keeper transistor 271. Thus, first keeper transistor 271 and second keeper transistor 272 are cross-coupled to each other. As discussed below, keeper 270 is used to temporarily store the values determined by first evaluation block 230 and second evaluation block 240. In other embodiments, the gate does not use a keeper.

First evaluation block 230 and second evaluation block each have a plurality of transistors. In the embodiment shown, first evaluation block 230 comprises four transistors (first transistor 231, second transistor 232, third transistor 233, and fourth transistor 234) and second evaluation block 240 comprises four transistors (fifth transistor 241, sixth transistor 242, seventh transistor 243, and eight transistor 244). In first evaluation block 230, the source of first transistor 231 is connected to the drain of second transistor 232, and the source of third transistor 233 is connected to the drain of fourth transistor 234. The drain of first transistor 231 and of third transistor 233 is connected to negative output 213. The source of second transistor 232 and of fourth transistor 234 is connected to footer transistor 215. In second evaluation block 240, the source of fifth transistor 241 is connected to the drain of sixth transistor 242, and the source of seventh transistor 243 is connected to the drain of eighth transistor 244. The drain of fifth transistor 241 and of seventh transistor 243 is connected to output 223. The source of the sixth transistor 242 and eighth transistor 244 are connected to footer transistor 215. In this embodiment, the gate of each of the transistors in the first evaluation block 230 is connected to either first input 211 or second input 212, and the gate of each of the transistors in the first evaluation block 240 is connected to either negative first input 221 or negative second input 222. In particular, first input 211 is connected to the gate of second transistor 232 and third transistor 233, second input 212 is connected to the gate of first transistor 231 and fourth transistor 234, negative first input 221 is connected to the gate of fifth transistor 241 and sixth transistor 242, and negative second input 222 is connected to the gate of seventh transistor 243 and eighth transistor 244. The operation of symmetric differential domino AND gate 200 is described below with reference to FIG. 3.

As a consequence of its topology, the differential domino AND gate 200 shown in this embodiment is a symmetric differential domino AND gate. In an embodiment, the load for the true inputs 211 and 212 is the same as the load for the compliment inputs 221 and 222, the pull down strength for the true inputs 211 and 212 is the same as the pull down strength for the complement inputs 221 and 222, and the pull down strength for the true output 223 is the same as the pull down strength for the complement output 213. In addition, in symmetric differential domino AND gate 200 the Miller coupling for the true inputs (211 and 212) is equal to the Miller coupling for the compliment inputs (221 and 222) and the output drive strength for the true output (223) is the same as the output drive strength for the compliment output (213). In an embodiment, transistors 231 to 234 and 241 to 244 are NMOS transistors. In this embodiment, the gate does not have any stacked PMOS devices. In an embodiment, each of transistors 231 to 234 and 241 to 244 are 1.78 microns. In a further embodiment the size of footer transistor 215 is 2.14 microns. In a further embodiment the size of precharge transistor 251, second precharge transistor 252, first keeper transistor 271, and second keeper transistor 272 are 1.52 microns. Of course, transistors with other sizes may also be used.

First evaluation block 230 and second evaluation block 240 both comprise a plurality of transistors connected in a parallel relationship to each other and a plurality of transistors connected in a serial relationship to each other. For example, first transistor 231 and second transistor 232 are in a serial relationship to each other because they are arranged serially as a stack along the path from the current source (footer transistor 215) to negative output 213. As used herein, a current source is a path to ground. As another example, first transistor 231 is in a parallel relationship to both third transistor 233 and fourth transistor 234 because first transistor 231 is a parallel path (i.e., from the source to negative output 213) as compared to third transistor 233 and fourth transistor 234. In this embodiment, the second evaluation block 240 has the same number of transistors in a parallel relationship as the first evaluation block 230 and the same number of transistors in a serial relationship as first evaluation block 230. For example first evaluation block 230 has two pair of transistors that are in serial relationship to one another and two sets of transistors that are in parallel relationship to each other.

FIG. 3 is a partial timing diagram that illustrates a snapshot of the operation of a symmetric differential domino AND gate according to an embodiment of the present invention. FIG. 3 shows waveforms for inputs and outputs to a symmetrical AND gate such as shown in FIG. 2. FIG. 3 shows time 301 along the x axis in units of picoseconds and voltage levels 302 along the y axis in units of 0.1 volts. FIG. 3 shows the following six waveforms: inputs 311 and 312, output 323, inputs 321 and 322, and output 313. Input 311 and input 312 are very close together so as to appear almost as one waveform. Thus, in this example, inputs 311 and 312 are receiving the same values. Similarly, input 321 and input 322 are very close together so as to appear almost as one waveform. In an embodiment, inputs 311 and 312 correspond to inputs 211 and 212 of FIG. 2, output 323 corresponds to output 213 of FIG. 2, inputs 321 and 322 correspond to inputs 221 and 222 of FIG. 2, and output 313 corresponds to output 213 of FIG. 2. FIG. 3 also shows the delays between waveforms in picoseconds (e.g., 26.2, 95.0, 10.1, 118.5, 26,3). During the precharge phase (e.g., at time=150 ps), the outputs 313 and 323 are both at the same predetermined high value. As the inputs 311 and 312 change from a high value (1 volt) to a low value (0 volts), the output 332 (which represents the AND for 311 and 312) also changes from a high value to a low value after a delay to get through the circuit. Similarly, as the inputs 321 and 322 change from a high value (1 volt) to a low value (0.8 volts), the output 313 (which represents the AND for 321 and 322) also changes from a high value to a low value after a delay to get through the circuit. A person of skill in the art would of course appreciate that the waveforms shown in FIG. 3 are just a sample of the waveforms that may occur for a circuit according to an embodiment of the present invention. In other embodiments, for example, the wavelengths, voltage ranges, and delays may be different.

Figure 4:
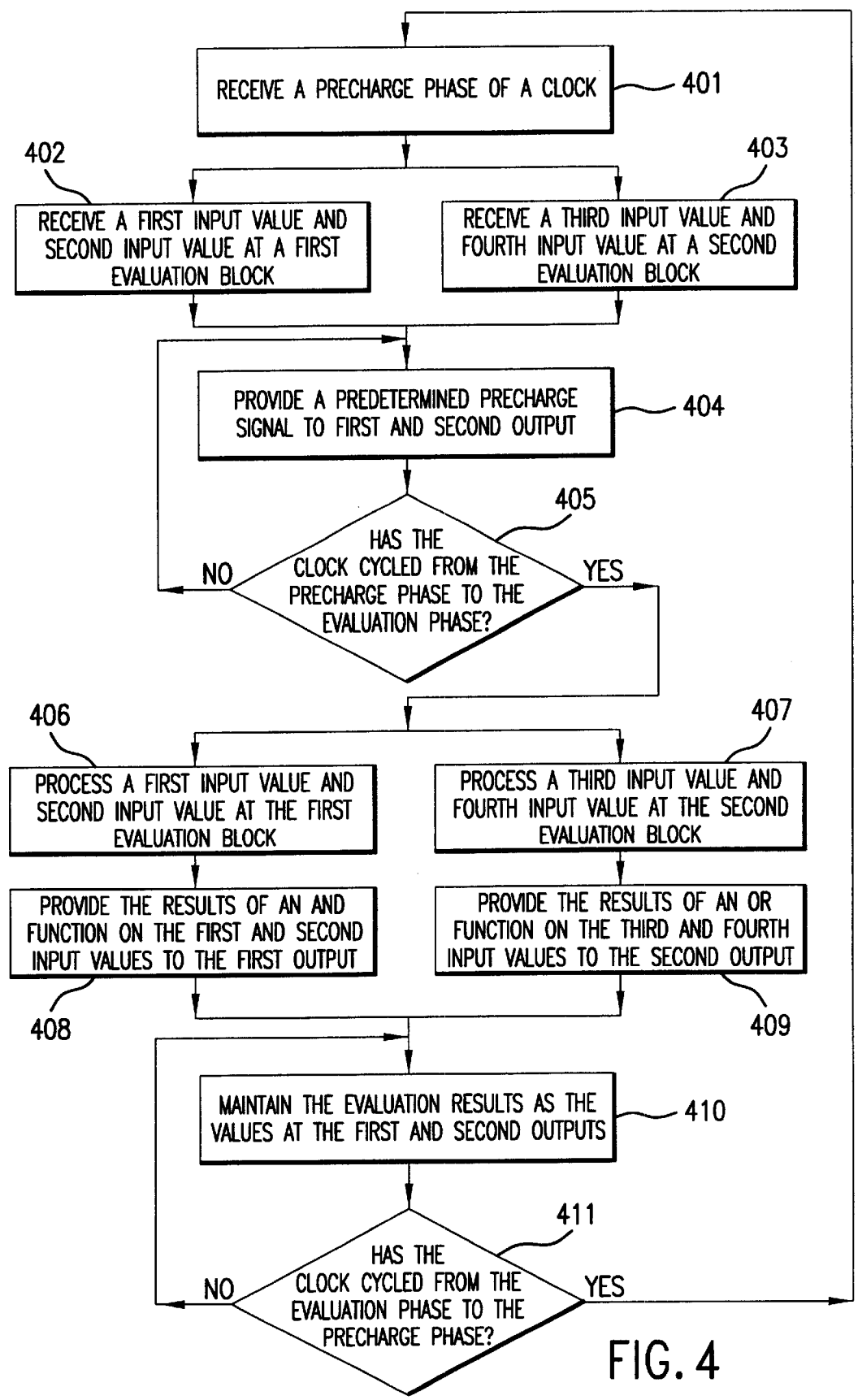
FIG. 4 is a flow diagram of a method of performing a differential AND function according to an embodiment of the present invention.

FIG. 4 is a flow diagram of a method of performing a differential AND function according to an embodiment of the present invention. The method shown in FIG. 4 may be performed by a symmetric differential AND gate such as shown in FIG. 2. According to this method, a precharge phase of a clock is received by the circuit (401). A first input value and second input value are received at a first evaluation block (402) and a third input value and fourth input value are received at a second evaluation block (403). In an embodiment, the first, second, third and fourth input values are received by the circuit at the same time as the precharge phase of the clock. A predetermined precharge signal is provided by the circuit to first and second outputs (404). This precharge signal maybe provided during the duration of the precharge phase as determined by the clock. In an embodiment, these inputs values are received at substantially the same time. As this is a differential gate, the third input value may be the compliment of the first input value and the fourth input value may be the compliment of the third input value, in which case the first and second input values may be the true inputs and the third and fourth input values may be the compliment inputs.

At some point, the clock cycles from the precharge phase to an evaluation phase. As shown in FIG. 4, after the clock cycles to the evaluation phase (405), the first, second, third, and fourth inputs may be processed. In an embodiment, when the clock cycles to the evaluation phase, a current source maybe provided to the first and second evaluation blocks. The current source may be, for example, the footer transistor 215 which is connected to ground and to the evaluation blocks as described above with reference to FIG. 2. A person of skill in the art would appreciate that footer 215 disables the current source during the precharge phase of the clock and enables the current source during the evaluation phase. As shown in FIG. 4, the first and second input values are processed in the first evaluation block to select one of a plurality of stacks from a current source through said first evaluation block to a first output (406). In a further embodiment, the number of transistors in each of these stacks is the same. The third and fourth input values may be processed by the second evaluation block to select one of a plurality of stacks from a current source though the second evaluation block to a second output (407). In an embodiment, the number of transistors in each of the stacks in the second evaluation block is the same as the stacks though the first evaluation block. In an embodiment, processing of the first, second, third, and fourth inputs may take place at the same time. In an embodiment, the transistors in the first evaluation block and second evaluation block are the same size.

As shown in FIG. 4, the first evaluation block provides to the first output the results of an AND function on the first and second input values (408) and the second evaluation block provides to the second output the results of an OR function on the third and fourth input values (409). In a further embodiment, the output from the first evaluation block and second evaluation block is provided to a keeper which maintains these values as the outputs of the circuit during the remainder of the evaluation phase (410). This process may be repeated when the clock cycles back to the precharge phase (411).

An embodiment of the processing of the first and second inputs values by the first evaluation block and the processing of the third and fourth input values by the second evaluation block is described below. The following description references components shown in the embodiment in FIG. 2, but of course other embodiments may operate in a similar fashion. A person of ordinary skill in the art would appreciate that in this embodiment current flows from drain to source, the NMOS transistors drive the drain high when the current is turned on, and the PMOS transistors drive the drain low when turned on. In the embodiment of FIG. 2, when the clock changes to the evaluation phase, the footer transistor 215 is turned on and the drain of footer transistor 215, which is connected to the sources of the transistors at the bottom of the first evaluation block 230 and second evaluation block 240, is driven high. This would cause a high value to be output at negative output 213 if the both the transistors in the first stack (231 and 232) are turned on or both the transistors in the second stack (233 and 234) are turned on. Thus, negative output 213 will be driven high only if a high value is input at both first input 211 and second input 212. The first evaluation block therefore performs an AND operation on the first input 211 and second input 212 and outputs the results to negative output 213. Similarly, output 233 would be driven high if both the transistors in the first stack (241 and 242) of the second evaluation block are turned on or both the transistors in the second stack (243 and 244) are turned on. Thus, output 233 will be driven high if a high value is input at negative first input 221 or negative second input 222. The second evaluation block therefore performs an OR operation on negative first input 221 and negative second input 222 and drives output 233 to zero. Because the second set of inputs (221 and 222) is the compliment of the first set of inputs (211 and 212), the circuit will provide at output 223 the results of an AND operation on first input 211 and second input 212 and will provide at negative output 213 the compliment of output 223 (i.e., the results of an OR operation on negative first input 221 and negative second input 222).

Differential AND gates having symmetric topologies as described above have true and compliment outputs that begin to switch with the same edge rate and are not be susceptible to pattern dependence. Thus, these differential AND gates are easier to design and manufacture. The cascaded differential domino AND gate disclosed is relatively faster than prior gates because the circuit disclosed does not need to wait for the input to reach Vcc/2 (the gate threshold) before beginning to switch. The differential logic may act as a sense amp and allow for the clock to drive the transition with small differentials on the inputs. In embodiments of the invention, the AND gate has a series of NMOS transistors at the bottom of the NMOS tree that are driven by the clock, and the same transistors are present for both sides of the gate. Embodiments have series and parallel transistors on both sides of the gate and have transistors that are not used for the normal logic function connected to the output of the opposite polarity. The use of a higher NMOS stack may reduce leakage current. In an embodiment, PMOS keepers are sized to prevent cross-capacitance noise from disturbing the state of the logic.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A symmetric differential domino AND gate circuit comprising: a first evaluation block and a second evaluation block each having a plurality of transistors arranged in stacks, each stack being part of a connection from an output of the symmetric differential domino AND gate to ground, wherein the number of transistors in each of said stacks is the same.

2. The symmetric differential domino AND gate circuit of claim 1, wherein the circuit has a true output and a compliment output, and wherein the output drive strength for the true output is the same as the output drive strength for the compliment output.

3. A circuit comprising a differential domino AND gate having true inputs, compliment inputs, a true output, and a compliment output, wherein the load for the true inputs is the same as the load for the compliment inputs, wherein the pull down strength for the true output is the same as the pull down strength for the complement output, and wherein the pull down strength for the true inputs is the same as the pull down strength for the complement inputs.

4. The circuit of claim 3, wherein the circuit has a first evaluation block of transistors and a second evaluation block of transistors, and wherein the first evaluation block and second evaluation block have the same number of transistors.

5. The circuit of claim 4, wherein the gate of each of the transistors in the first evaluation block and the second evaluation block is connected to one of true inputs or compliment inputs.

6. The circuit of claim 4, wherein the first evaluation block comprises a plurality of transistors connected in a parallel relationship to each other and a plurality of transistors connected in a serial relationship to each other, wherein the second evaluation block comprises a plurality of transistors connected in a parallel relationship to each other and a plurality of transistors connected in a serial relationship to each other, and wherein the second evaluation block has the same number of transistors in said parallel relationship as the first evaluation block and the same number of transistors in said serial relationship as the first evaluation block.

7. A circuit comprising:
   a clock input to provide a clock having precharge and evaluation phases;
   a first output to provide a precharge signal during the precharge phase and an evaluation result during the evaluation phase;
   a second output to provide the precharge signal during the precharge phase and an evaluation result during the evaluation phase;
   a current source;
   a first evaluation block connected to the current source and the first output to provide the result of an AND function of a first set of inputs during the evaluation phase, the first evaluation block having a plurality of transistors arranged in serial stacks between the current source and the first output, wherein the number of transistors in each stack is the same; and
   a second evaluation block connected to the current source and a second output to provide the result of an OR function of a second set of inputs during the evaluation phase, said second evaluation block having a plurality of transistors arranged in serial stacks between the current source and the second output, wherein the number of transistors in each second evaluation block serial stack is the same as in the first evaluation block serial stacks.

8. The circuit of claim 7, wherein the current source is a transistor having a source node connected to ground and a gate connected to the clock input.

9. The circuit of claim 7, wherein the transistors in said stacks are all the same size.

10. The circuit of claim 7, wherein the gates of the transistors in the first evaluation block are each connected to one of the first set of inputs, and wherein the gates of the transistors in the second evaluation block are each connected to one of the second set of inputs.

11. The circuit of claim 7, wherein the output drive strength for the first output is the same as the output drive strength for the second output.

12. The circuit of claim 11, wherein the pull down strength for each input in the first set of inputs is the same as the pull down strength for each input in the second set of outputs, and wherein the pull down strength for the first output is the same as the pull down strength for the second output.

13. The circuit of claim 12, wherein the Miller coupling for the first set of inputs is the same as the Miller coupling for the second set of inputs.

14. A circuit comprising:
 a plurality of data inputs comprising first inputs and second inputs, wherein each of the second inputs corresponds to one of the first inputs;
 a clock input to receive a clock pulse having evaluation and precharge phases;
 a first output to output the results of an AND function of said first inputs during the evaluation phase;
 a second output to output the results of an OR function of said second inputs during the evaluation phase;
 a precharge block to provide a predetermined precharge value at the first output and second output during the precharge phase;
 a current source; and
 a first evaluation block comprising a first transistor with a drain connected to the first output, a second transistor with a drain connected to the source of the first transistor and a source connected to the current source, a third transistor with a drain connected to the first output, and a fourth transistor with a drain connected to the source of the third transistor and a source connected to the current source, wherein the gates of the first transistor and fourth transistor are connected to one of the first inputs, and wherein the gates of the second transistor and third transistor are connected to another of the first inputs.

15. The circuit of claim 14, wherein the circuit further comprises a second evaluation block that comprises a fifth transistor with a drain connected to the second output, a sixth transistor with a drain connected to the source of the fifth transistor and a source connected to the current source, a seventh transistor with a drain connected to the second output, and an eighth transistor with a drain connected to the source of the seventh transistor and a source connected to the current source, wherein the gates of the fifth transistor and sixth transistor are connected to one of the second inputs, and wherein the gates of the seventh transistor and eighth transistor are connected to another of the second inputs.

16. The circuit of claim 15, wherein the current source is a transistor having a source connected to ground and a gate connected to the clock.

17. The circuit of claim 15, wherein the precharge block comprises a first precharge transistor and a second precharge transistor, and wherein the first and second precharge transistors each have a gate connected to the clock.

18. The circuit of claim 17, wherein the circuit further comprises a keeper connected to the first output, second output, first evaluation block, and second evaluation block.

19. The circuit of claim 18, wherein the transistors in the first evaluation block and second evaluation block are N-channel metal-oxide semiconductor (NMOS) transistors, wherein first and second precharge transistor are P-channel metal-oxide semiconductor (PMOS) transistors, and wherein the keeper comprises two PMOS transistors.

20. A method of performing a differential AND function, the method comprising:
 receiving at a first evaluation block a first input value and a second input value and receiving at a second evaluation block a third input value and a fourth input value, wherein the third input value is the compliment of the first input value and the fourth input value is the compliment of the third input value;
 receiving a clock having a precharge phase and an evaluation phase;
 providing predetermined precharge signals at the first and second outputs during said precharge phase;
 processing the first and second input values at the first evaluation block to select one of a plurality of stacks from a current source through said first evaluation block to a first output, wherein the number of transistors in each of said stacks is the same, and wherein said processing provides the results of an AND function on the first and second input values at the first output during the evaluation phase; and
 processing the third and fourth input values at the second evaluation block to select one of a plurality of stacks from a current source though said second evaluation block to a second output, wherein the number of transistors in each of said stacks is the same as the stacks through the first evaluation block, and wherein said processing provides the results of an OR function on the third and fourth input values at the second output during the evaluation phase.

21. The method of claim 20, wherein the method further comprises disabling said current source during said precharge phase and enabling said current source during said evaluation phase.

22. The method of claim 20, wherein the method further comprises:
 providing the output from the first evaluation block to a keeper;
 providing the output from the second evaluation block to a keeper;
 providing results of an AND value on the first and second input values at the first output during the evaluation phase based upon output from the first evaluation block and the keeper; and
 providing results of an OR value on the third and fourth input values at the second output during the evaluation phase based upon output from the second evaluation block and the keeper.

23. The method of claim 20, wherein the inputs received and outputs provided are symmetrical.

24. A differential domino circuit comprising:
 a first symmetrical differential domino AND gate comprising a first evaluation block and a second evaluation block each having a plurality of transistors arranged in stacks, each stack being part of a connection from an output of the symmetric differential domino AND gate to ground, wherein the number of transistors in each of said stacks is the same;
 a second symmetrical differential domino gate connected to the first symmetrical differential domino gate;
 a converter connected to the second symmetric differential domino gate; and
 a clock block connected to the first symmetric differential domino gate, second symmetric differential domino gate, and the converter.

25. The differential domino circuit of claim 24, wherein the first symmetrical differential domino gate does not have any stacked PMOS devices.

26. The differential domino circuit of claim 24, wherein the differential domino circuit is a cascaded domino circuit.

27. The differential domino circuit of claim 24, wherein the converter is adapted to convert signals to static logic signals.

28. A circuit comprising a symmetric differential domino AND gate, wherein the symmetric differential domino AND gate comprises a first evaluation block and second evaluation block each having a plurality of transistors arranged in stacks, each stack being part of a connection from an output of the symmetric differential domino AND gate to ground, wherein the number of transistors in each of said stacks is the same, and wherein the circuit does not include a path from an output of the symmetric differential domino AND gate to ground which includes transistors in both the first evaluation block and the second evaluation block.

29. The circuit of claim 28, wherein the circuit has a true output and a compliment output, and wherein the output drive strength for the true output is the same as the output drive strength for the compliment output.

30. The circuit of claim 28, wherein the circuit has a true output and a compliment output, and wherein the pull down strength for the true output is the same as the pull down strength for the complement output.

31. The circuit of claim 28, wherein the circuit has true inputs and compliment inputs, and wherein the load for the true inputs to the circuit is the same as the load for the compliment inputs.

32. The circuit of claim 28, wherein the circuit has true inputs and compliment inputs, and wherein the pull down strength for the true inputs is the same as the pull down strength for the complement inputs.

* * * * *